United States Patent [19]

Yakovlev et al.

[11] 4,392,106

[45] Jul. 5, 1983

[54] NON-CONTACT DEVICE FOR MONITORING ELECTRICAL PULSE SIGNALS

[76] Inventors: Nikolai I. Yakovlev, ulitsa O. Forsh, 3, kv. 101; Anatoly T. Smolin, Grazhdansky prospekt, 19, korpus 1, kv. 1; Vasily G. Kokovikhin, ulitsa Vernosti, 38, korpus 1, kv. 53; Alexei A. Kotunov, ulitsa 3 Internatsionala, 57, kv. 46, all of Leningrad, U.S.S.R.

[21] Appl. No.: 223,047

[22] Filed: Jan. 7, 1981

[51] Int. Cl.³ .................................. G01R 31/02
[52] U.S. Cl. ................................. 324/72.5; 324/119
[58] Field of Search ............. 324/72, 72.5, 119, 179

[56] References Cited

U.S. PATENT DOCUMENTS 2,442,765  6/1948  Franklin ......................... 324/179
3,384,805  5/1968  Exworthy ....................... 324/119

Primary Examiner—Michael J. Tokar
Attorney, Agent, or Firm—Lilling & Greenspan

[57] ABSTRACT

A non-contact device for monitoring electrical pulse signals includes a sensing means responsive to variation with time of the electromagnetic field produced by the monitored pulse signals, an amplifier connected to the sensing means, a rectifier connected to the amplifier via a network including an aperiodic circuit and a differentiating circuit connected in series, and an indicator unit connected to the rectifier.

2 Claims, 26 Drawing Figures

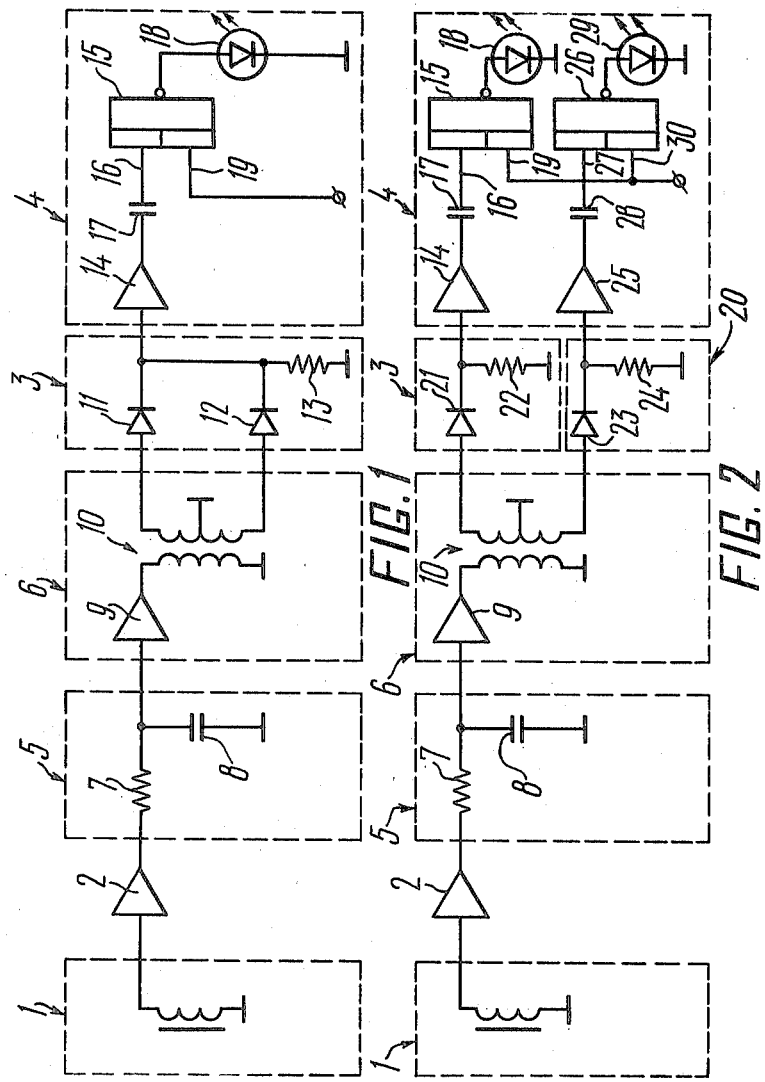

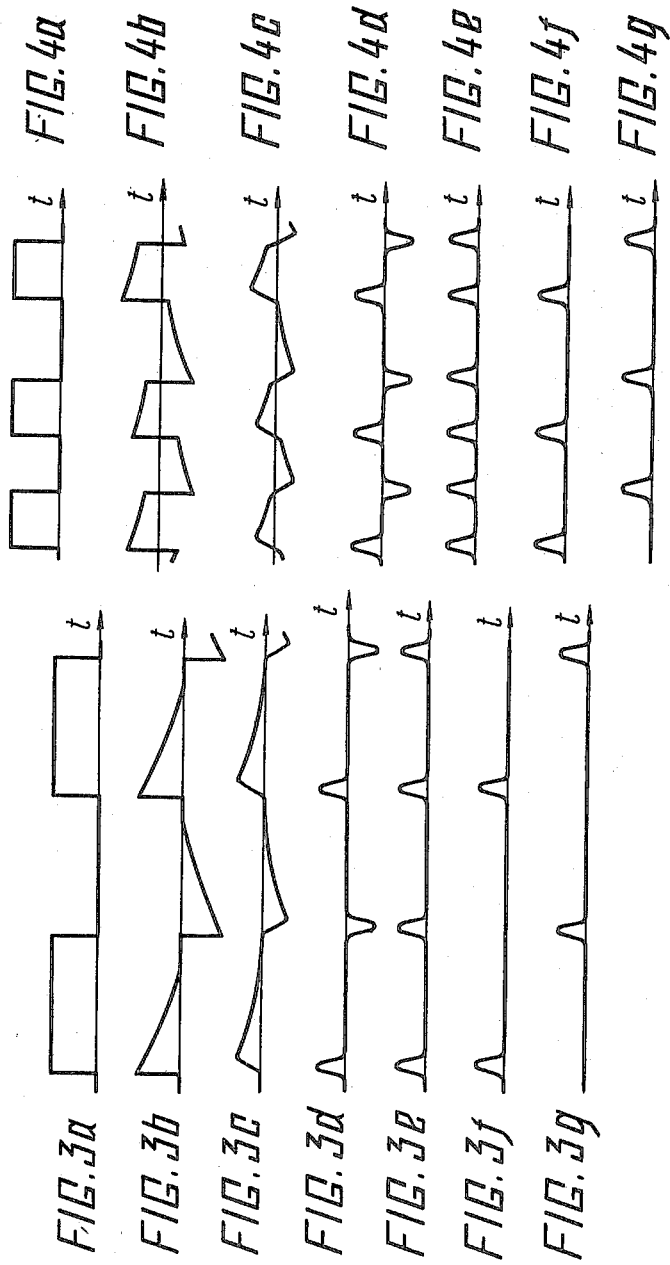

NON-CONTACT DEVICE FOR MONITORING ELECTRICAL PULSE SIGNALS

FIELD OF THE INVENTION

The present invention relates to electrical measuring instruments, and more particularly to non-contact devices for monitoring electrical pulse signals.

The present invention can be used for testing electronic logic circuits. The present invention can most advantageously be used for detecting faults in electronic logic units manufactured with the use of printed circuit techniques.

BACKGROUND OF THE INVENTION

During testing of electronic circuits there arises a necessity for monitoring voltage or current pulses in the circuits of the unit under test without making electric contact with the circuit elements. Such a need exists, for example, if the unit has a protective isolating coating which must not be broken or if current pulses in the unit circuits must be monitored without opening said circuits. In such cases non-contact measuring devices are used. These devices are provided with a sensing means responsive to electromagnetic field variations arising due to variation of currents and voltages in the unit circuits. The sensing means converts the field variations into an electrical signal, the magnitude of which depends on the amplitude of the electrical pulse appearing at the circuit point near which the sensing means is placed. This electrical signal is supplied to the input of an indicator unit which in some way or other responds to the magnitude of said signal. This permits monitoring of electrical pulses in the circuits of electronic units without making electric contact with the circuit elements. Monitoring of voltage pulses is achieved by the use of devices wherein the sensing means is a capacitive transducer responsive to the electric component of electromagnetic field. Monitoring of current pulses is achieved by the use of devices wherein the sensing means is an inductive transducer responsive to the magnetic component of electromagnetic field.

DESCRIPTION OF THE PRIOR ART

Known in the art is a non-contact device for monitoring electrical pulse signals comprising a sensing means responsive to variation with time of the electromagnetic field produced by the monitored pulse signal, an amplifier connected to the output of the sensing means, a rectifier, connected to the output of the amplifier, and an indicator unit having its input connected to the output of the rectifier (cf. "Hewlett-Packard Journal", vol. 28, No. 4, December 1976, p. 5, FIG. 5).

When electrical pulses in the circuit under test have a relatively small frequency at which the repetition period of the pulses is much greater than the time constant of the sensing means, the amplitude of the signal at the output of the sensing means does not depend on the frequency and on-off ratio of the pulses in the circuit under test and, with the edges of the pulses being sufficiently steep, is determined by the amplitude of the pulses. If, however, the monitored pulses have a relatively high frequency at which their repetition period is commensurable with, or less than, the time constant of the sensing means, the amplitude of the signal at the output of the sensing means depends on the frequency and on-off ratio of the monitored pulses. This is due to the fact that the sensing means responds not to the absolute magnitude of the intensity of electromagnetic field, but to variations in said intensity so that the direct component of the signal in the circuit under test does not affect the output of the sensing means. Therefore, with a relatively high frequency of the pulses in the circuit under test the known device will respond to pulses having the same amplitudes but different frequencies as to pulses having different amplitudes. This problem cannot be solved by reducing the time constant of the sensing means because such a reduction leads to a decrease in its sensitivity. Thus, the known device is not capable of accurately monitoring electrically pulse signals over a wide range of variation of their frequencies.

SUMMARY OF THE INVENTION

Accordingly, it is an object of the present invention to provide a non-contact device for monitoring electrical pulse signals, which ensures the required accuracy of monitoring over a wide range of variation of the frequencies of the monitored signals.

It is another object of the present invention to provide a non-contact device for monitoring electrical pulse signals, which is designed so as to increase, without reducing the time constant of the sensing means, the maximum value of the frequency of the monitored signals, at which the frequency and on-off ratio of said signals do not affect the results of monitoring.

With these and other objects in view there is proposed a non-contact device for monitoring electrical pulse signals comprising a sensing means responsive to variation with time of the electromagnetic field produced by the monitored pulse signal, an amplifier connected to the output of the sensing means, a rectifier, and an indicator unit having its input connected to the output of the rectifier. The device, according to the invention, further comprises an aperiodic circuit and a differentiating circuit connected in series between the output of the amplifier and the input of the rectifier.

If the time constant of the differentiating circuit is sufficiently small, the proposed device provides, without reducing the time constant of the sensing element, a higher maximum value of the frequency of the monitored pulse signals at which their frequency and on-off ratio do not affect the results of monitoring. This ensures the required accuracy of monitoring over a wide range of variation of the frequencies of the monitored signals. The aperiodic circuit connected in series with the differentiating circuit provides compensation for the influence of the duration of the edges of the monitored pulses on the results of monitoring, which influence is due to the small time constant of the differentiating circuit.

To eliminate errors arising from zero drift when direct current amplifiers are used, it is preferable to use an indicator unit responsive to the alternating current component of its input signal. With such an indicator unit, it is expedient to use two rectifiers having their inputs connected to the output of the amplifier via the aperiodic circuit and the differentiating circuit. This generates at the output of one rectifier signals proportional to signals of one polarity at the output of the network including the aperiodic circuit and the differentiating circuit, and generates at the output of the other rectifier signals proportional to signals of the other polarity at the output of the network including the aperiodic circuit and the differentiating circuit. The indicator unit in such a case has two inputs which are respectively connected to the outputs of the rectifiers and responds to the alternating current components of the signals at the outputs of the rectifiers.

With the indicator unit responsive to the alternating current components of its input signals, the employment of two separate rectifiers ensures a higher maximum value of the frequency of the monitored pulse signals at which their frequency and on-off ratio do not affect the results of monitoring and thereby provides a wider frequency range within which the required accuracy of monitoring is ensured.

BRIEF DESCRIPTION OF THE DRAWINGS

The aforementioned and other objects and advantages of the present invention will become more apparent upon consideration of the following detailed description of its preferred embodiments taken in conjunction with the accompanying drawings.

FIG. 1 is a schematic diagram of a non-contact device for monitoring electrical pulse signals, according to one embodiment of the invention;

FIG. 2 is a schematic diagram of a non-contact device for monitoring electrical pulse signals, according to another embodiment of the invention; and FIGS. 3(a-g), 4(a-g) and 5(a-j) are graphes, showing timing diagrams showing variations of the monitored signals having different frequencies, and corresponding variations of signals at various points in the circuits shown in FIGS. 1 and 2.

DETAILED DESCRIPTION OF THE INVENTION

Figure 5A:
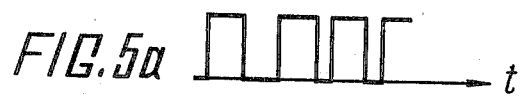

Referring to FIG. 1, the non-contact device for monitoring electrical pulse signals comprises a sensing means constituted by an inductive transducer 1 which responds to variation in the intensity of the magnetic component of an electromagnetic field, an alternating-current amplifier 2 having its input connected to the output of the transducer 1, a rectifier 3, and an indicator unit 4 having its input connected to the output of the rectifier 3. The device further comprises an aperiodic circuit 5 and a differentiating circuit 6 connected in series between the output of the amplifier 2 and the input of the rectifier 3.

The aperiodic circuit 5 is an integrating RC-circuit including a resistor 7 and a capacitor 8. The differentiating circuit 6 includes an alternating-current amplifier 9, having its input connected across the capacitor 8, and a differentiating transformer 10, having a primary winding connected to the output of the amplifier 9 and a secondary winding having its middle point connected to ground.

The rectifier 3 is a full-wave rectifier comprising two diodes 11 and 12 the anodes of which form the input terminals of the rectifier 3 and are connected to the opposite terminals of the secondary winding of the transformer 10 of the differentiating circuit 6. The interconnected cathodes of the diodes 11 and 12, form the output terminal of the rectifier 3 and are connected to ground via a resistor 13.

The indicator unit 4 comprises an alternating-current amplifier 14, the input of which forms the input of the indicator unit 4 and is connected to the output of the rectifier 3, a flip-flop 15 having one input 16 connected through a capacitor 17 to the output of the amplifier 14, and a signal element constituted by a light-emitting diode 18 and connected to the output of the flip-flop 15.

The flip-flop 15 has another input 19 supplied with pulses resetting the flip-flop 15.

Referring to FIG. 2, the rectifier 3 is a half-wave rectifier, and the device further comprises another half-wave rectifier 20. The rectifier 3 comprises a diode 21, the anode of which forms the input terminal of the rectifier 3 and is connected to one of the terminals of the secondary winding of the transformer 10, the cathode of the diode 21 forming the output terminal of the rectifier 3 and being connected to ground via a resistor 22. The rectifier 20 comprises a diode 23, the anode of which forms the input terminal of the rectifier 20 and is connected in the other terminal of the secondary winding of the transformer 10, the cathode of the diode 23 forming the output terminal of the rectifier 20 and being connected to ground via a resistor 24. The indicator unit 4, in addition to the amplifier 14, the flip-flop 15 and the light-emitting diode 18, comprises another alternating-current amplifier 25, the input of which forms a second input of the indicator unit 4, another flip-flop 26 having one input 27 connected through a capacitor 28 to the output of the amplifier 25, and a signal element constituted by a light-emitting diode 29 and connected to the output of the flip-flop 26. The flip-flop 26 has another input 30 to be supplied with pulses resetting the flip-flop 26. The inputs of the indicator unit 4 are respectively connected to the outputs of the rectifiers 3 and 20.

The operation of the circuits shown in FIGS. 1 and 2 is explained with reference to FIGS. 3(a-g), 4(a-g) and 5(a-j) showing timing diagrams which show variations of the monitored pulse signals having different frequencies and corresponding variations of signals at various points in the circuits.

When used, the device is positioned so that the transducer 1 (FIG. 1) is located near that point of an electronic circuit at which the signal is to be monitored. An electrical pulse appearing at this point causes the transducer 1 to develop a corresponding signal at its output.

FIG. 3a shows variation of a monitored signal having a relatively low frequency at which the repetition period of the pulses is substantially greater than the time constant of the transducer 1 (FIG. 1). In this case the transducer 1 develops at its output a bipolar pulse train as shown in FIG. 3b. The amplitude of each of the pulses of this train is proportional to the amplitude of the monitored pulses and is independent of their frequency and on-off ratio. The pulses developes at the output of the transducer 1 (FIG. 1) are amplified by the amplifier 2 and applied to the RC-circuit of the aperiodic circuit 5. After passing through the RC-circuit 7 and 8, the duration of the pulse edges is increased as shown in FIG. 3c which shows variation of the signal at the output of the aperiodic circuit 5 (FIG. 1). The pulses developed at the output of the aperiodic circuit 5 are amplified by the amplifier 9 and applied to the transformer 10 whose parameters are chosen so that it provides differentiation of the pulses supplied from the output of the amplifier 9 with a time constant which is substantially smaller than the time constant of the transducer 1. As a result, the differentiating circuit 6 develops at its output, i.e., between the terminals of the secondary winding of the transformer 10, a train of short bipolar pulses having the same frequency as the pulses at the output of the transducer 1 but a substantially smaller duration, as shown in FIG. 3d. The time constant of the aperiodic circuit 5 (FIG. 1) is chosen so that it is greater than the maximum possible duration of the edges of the monitored pulses so that the duration of the edges of the pulses at the output of the aperiodic circuit 5 is practically independent of the duration of the edges of the monitored pulses. Therefore, in spite of the small time constant of the differentiating circuit 6, variation in the duration of the edges of the monitored pulses practically does not affect the amplitude of the pulses at the output of the differentiating circuit 6, which amplitude will thus be proportional to the amplitude of the monitored pulses. Bipolar pulses developed at the output of the differentiating circuit 6 are supplied from the secondary winding of the transformer 10 to the diodes 11 and 12 of the full-wave rectifier 3, as a result of which the latter develops at its output a unipolar pulse train as shown in FIG. 3e. These pulses are amplified by the alternating-current amplifier 14 (FIG. 1) and through the capacitor 17 are applied to the input 16 of the flip-flop 15. With the bandwidth of the amplifier 14 and the capacitance of the capacitor 17 sufficiently great, the signal at the input 16 of the flip-flop 15 will be proportional to the signal at the output of the rectifier 3, i.e. will have the appearance shown in FIG. 3e.

If the amplitude of the pulses at the input 16 of the flip-flop 15 (FIG. 1) exceeds the threshold of response of the flip-flop 15, the state of the flip-flop will be reversed and the light-emitting diode 18 will light up. Since the amplitude of the pulses at the output of the rectifier 3, like that of the signal at the output of the differentiating circuit 6, is independent of the frequency and on-off ratio of the monitored pulses, the amplitude of the pulses at the input 16 of the flip-flop 15 is also independent of the frequency and on-off ratio of the monitored pulses and is determined only by their amplitude and by the gains of the circuits constituting the device. By adjusting the gain of the amplifiers 2, 9 or 14 it is possible to set the minimum value of the amplitude of the monitored pulses which brings about operation of the flip-flop 15 and lighting of the light-emitting diode 18. This provides a means for estimation of the amplitude of the monitored pulses and thus makes it possible to judge the condition of the corresponding circuits of the unit under test. For the sake of convenience the flip-flop 15 may be substituted by several threshold circuits having different threshold levels, and the light-emitting diode 18 may be substituted by a digital display indicating the value of the amplitude of the monitored pulses in digital form.

Resetting of the flip-flop 15 and extinguishment of the light-emitting diode 18 is achieved by application of a pulse to the input 19 of the flip-flop 15. Application of the reset pulse may be accomplished manually or automatically, with the aid of a special generator (not shown) which generates reset pulses at predetermined time intervals.

When the circuit shown in FIG. 2 is used, variation of the voltage between the terminals of the secondary winding of the transformer 10 of the differentiating circuit 6 will proceed in the same way as in the circuit shown in FIG. 1, i.e., as shown in FIG. 3d, while the rectifiers 3 and 20 (FIG. 2) will develop at their outputs trains of unipolar pulses shifted in relation to each other by 180° and having a frequency which is half that of the pulses developed at the output of the rectifier 3 in the circuit shown in FIG. 1. The signal variations at the outputs of the rectifiers 3 (FIG. 2) and 20 are shown, respectively, in FIGS. 3f and 3g. In this case the input 16 of the flip-flop 15 is supplied with signals varying according to FIG. 3f, while the input 27 of the flip-flop 26 is supplied with signals varying according to FIG. 3g. The amplitudes of the signals at the inputs 16 and 27 of the flip-flops 15 (FIG. 2) and 26 in this case are also independent of the frequency and on-off ratio of the monitored pulses. If the amplitude of the monitored pulses exceeds the preset threshold level, then, depending on the direction in which the monitored signal changes, one of the flip-flops 15 or 26 reverses its state lighting the light-emitting diode 18 or 29. Resetting of the flip-flops 15 and 26 is achieved by supplying their inputs 19 and 30 with reset pulses as described above.

The employment of the alternating current-amplifiers 14 and 25 in the circuits shown in FIGS. 1 and 2 instead of direct current amplifiers provides elimination of zero drift at the outputs of these amplifiers and hence elimination of signal variations at the inputs 16 and 27 of the flip-flops 15 and 26 caused by such a drift whereby a higher accuracy of monitoring is achieved.

If the monitored pulses have a frequency at which their repetition period is commensurable with, or less than, the time constant of the transducer 1 (FIG. 1) but substantially greater than the time constant of the differentiating circuit 6, the device operates as follows.

The monitored pulse signal, whose variation is shown in FIG. 4a, causes the transducer 1 (FIG. 1) to develop at its output a bipolar pulse train which, because of the relatively large time constant of the transducer 1, will have the appearance shown in FIG. 4b. The amplitude of the pulses at the output of the transducer 1 (FIG. 1) in this case is determined not only by the amplitude of the monitored signal but also by the time constant of the transducer 1 and depends on the frequency and on-off ratio of the monitored pulses so that the amplitude of the pulses at the output of the transducer 1 will fall with and increase in the frequency of the monitored pulses, while variation in the on-off ratio of the monitored pulses will lead to an increase in the pulses of one polarity at the output of the transducer 1 and to reduction in the pulses of the other polarity. The amplitude of the pulses developed at the output of the aperiodic circuit 5 and shown in FIG. 4c will be similarly dependent on the frequency and on-off ratio of the monitored pulses. However, thanks to the small time constant of the differentiating circuit 6 (FIG. 1), the amplitude of the voltage pulses at the secondary winding of the transformer 10 in this case depends on the value by which the pulse signal at the output of the transducer 1 is changed upon a change in the monitored signal, said value being independent of the frequency and on-off ratio of the monitored pulses. Therefore the amplitude of the pulses at the output of the differentiating circuit 6 is also independent of the frequency and on-off ratio of the monitored pulses, so that variation of the signal at the output of the differentiating circuit 6 proceeds similar to its variation in the case of monitored signals having a low frequency, as was described above and as shown in FIG. 4d. The amplitudes of the pulses at the inputs 16 and 27 of the flip-flops 15 and 26 in the circuit shown in FIG. 2 are also independent of the frequency and on-off ratio of the monitored pulses, which permits a fair accuracy of monitoring. Variations of the signals at the input 16 of the flip-flop 15 in the circuit shown in FIG. 1 and at the inputs 16 and 27 of the flip-flops 15 and 26 in the circuit shown in FIG. 2 are similar to their variations in the case of monitored signals having a low frequency and are shown, respectively, in the FIGS. 4e, 4f and 4g.

Figure 5B:
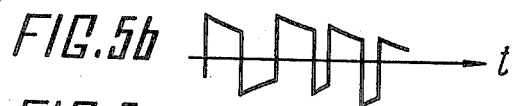
Figure 5C:
Figure 5D:
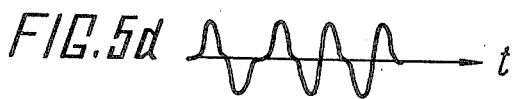
Figure 5E:
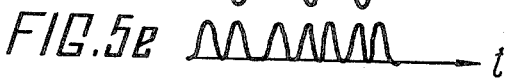
Figure 5F:
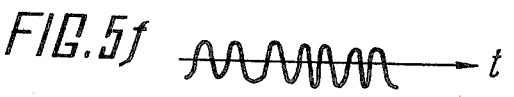

If the monitored pulses have a still higher frequency at which their repetition period not only exceeds the time constant of the transducer 1 (FIG. 1) but is commensurable with the time constant of the differentiating circuit 6, variations of the signals at the outputs of the transducer 1 and of the aperiodic circuit 5 proceed similar to their variations in the previous case as described above with reference to FIGS. 2b and 4c. Variations of the monitored pulse signal, of the signal at the output of the transducer 1 (FIG. 1) and of the signal at the output of the aperiodic circuit 5 when the repetition period of the monitored pulses is commensurable with the time constant of the differentiating circuit 6 are shown in FIGS. 5a, 5b and 5c, respectively. However, since in this case the time intervals during which the voltages at the outputs of the differentiating circuit 6 and of the rectifier 3 in the circuit shown in FIG. 1 have zero values are small or even absent altogether, as shown on FIGS. 5d and 5e, the input 16 of the flip-flop 15 (FIG. 1) is supplied from the output of the amplifier 14 with bipolar pulses whose amplitudes are strongly dependent on the frequency and on-off ratio of the monitored pulses as shown in FIG. 5f. Therefore the operation of the flip-flop 15 and of the light-emitting diode 18 will depend to the same degree on the frequency and on-off ratio of the monitored pulses so that the accuracy of monitoring provided by the circuit shown in FIG. 1 wil be rather low.

Figure 5G:
Figure 5H:
Figure 5I:
Figure 5J:

With the same frequency of the monitored pulses, the output signals of the rectifiers 3 and 20 in the circuit shown in FIG. 2 will represent trains of unipolar pulses separated by time intervals, the durations of which cannot be smaller than the durations of the pulses themselves as shown in FIGS. 5g and 5h, respectively. Because of this the frequency and on-off ratio of the monitored pulses will have relatively little influence on the amplitude of the pulses at the inputs 16 and 27 of the flip-flops 15 and 26 in the circuit shown in FIG. 2 as can be seen from FIGS. 5i and 5j, which show variations of the signals at the inputs 16 and 27 of the flip-flops 15 and 26, respectively. Thus the circuit shown in FIG. 2 will provide in this case a substantially higher accuracy of monitoring than the circuit shown in FIG. 1.

While the invention is described herein in the terms of its preferred embodiments, numerous modifications may be made without departure from the spirit and scope of the invention as defined in the appended claims.

It will be clear that other passive or active circuits having a transfer function of the aperiodic circuit, such as an aperiodic amplifier, can be used instead of the integreting RC-circuit 7 and 8. The differentiating transformer 10 may be substituted by other circuits having a transfer function of the differentiating circuit, such as a differentiating RC-circuit or a differentiating amplifier. The inductive transducer 1 may be substituted by a capacitive transducer responding to the electric component of electromagnetic field. The flip-flops 15 and 26 in the circuit shown in FIG. 2 may be substituted by circuits capable of developing output signals proportional to the amplitudes of the input signals, such as a bipolar pulse detector. The rectifiers 3 and 20 in the circuit shown in FIG. 2 may be made so that the pulses at their outputs will be opposite in polarity, in which case one of the amplifiers 14 or 25 may comprise an additional inverting stage to ensure the same polarity of the pulses at the inputs 16 and 27 of the flip-flops 15 and 26.

We claim:

1. A non-contact device for monitoring electrical pulse signals comprising:
   a sensing means responsive to variation with time of the electromagnetic field produced by the monitored pulse signal;
   an amplifier connected to said sensing means and having an output;
   a rectifier having an input and output;
   a network including an integrator circuit and a differentiating circuit connected in series, said network having an input connected to said output of said amplifier and an output connected to said input of said rectifier; and
   an indicator unit having an input connected to said output of said rectifier.

2. A non-contact device according to claim 1, which further comprises:
   a second rectifier having an input and an output, said inputs of said rectifiers being connected to said output of said network for developing at said output of one of said rectifiers signals proportional to signals of one polarity at said output of said network and for developing at said output of the other of said rectifiers signals proportional to signals of the other polarity at said output of said network,
   said indicator unit having a second input connected to said output of said second rectifier and being responsive to the alternating current components of the signals at said outputs of said rectifiers.

* * * * *